(12) United States Patent
Bhamidipati et al.

(10) Patent No.: US 12,326,481 B2
(45) Date of Patent: Jun. 10, 2025

(54) METHOD AND SYSTEM FOR MODELLING ULTRACAPACITOR

(71) Applicant: Siemens Aktiengesellschaft, Munich (DE)

(72) Inventors: Suryanarayana Bhamidipati, Karnataka (IN); Vijetha Jain, Bangalore (IN); Gladson Malekar, Davangere (IN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 209 days.

(21) Appl. No.: 18/202,729

(22) Filed: May 26, 2023

(65) Prior Publication Data

US 2024/0393409 A1 Nov. 28, 2024

(51) Int. Cl.
*G01R 31/12* (2020.01)
*G01R 31/64* (2020.01)
*G06F 30/367* (2020.01)
*H01G 11/08* (2013.01)

(52) U.S. Cl.
CPC .......... *G01R 31/64* (2020.01); *G06F 30/367* (2020.01); *H01G 11/08* (2013.01)

(58) Field of Classification Search
CPC .... G01R 31/64; G01R 31/367; G01R 31/379; G01R 31/389; G06F 30/20; G06F 30/367; H01G 11/08
See application file for complete search history.

(56) References Cited

U.S. PATENT DOCUMENTS

| | | | | |
|---|---|---|---|---|
| 2004/0212367 | A1* | 10/2004 | Dougherty | G01R 31/367 324/426 |
| 2015/0127280 | A1* | 5/2015 | Baba | G01R 31/3842 702/63 |
| 2016/0103184 | A1* | 4/2016 | Kawai | G01R 31/389 702/63 |
| 2024/0255579 | A1* | 8/2024 | Yoshioka | H01M 10/44 |

* cited by examiner

*Primary Examiner* — Thang X Le
(74) *Attorney, Agent, or Firm* — Schmeiser, Olsen & Watts LLP

(57) ABSTRACT

A method and a system for modelling an ultracapacitor are disclosed. The method involves modelling the ultracapacitor using measured and simulated charge-discharge plots. Measured plots are obtained from a capacitor modelling apparatus that uses one or more constant currents and/or voltages, while simulated plots are generated by a simulation platform using same constant currents and/or voltages values and an initial set of values for capacitors and resistors in a circuit model employing RC ladder-based electrical equivalent circuit model of the ultracapacitor. An optimization process adjusts the initial values of capacitors and resistors in the circuit model to make the simulated plots converge with the measured plots. The final values of capacitors and resistors are determined based on the converged simulated plots, matching the behaviour of the given ultracapacitor, providing an accurate representation of behaviour of the ultracapacitor.

15 Claims, 7 Drawing Sheets

METHOD AND SYSTEM FOR MODELLING ULTRACAPACITOR

FIELD OF TECHNOLOGY

The following relates generally to the field of ultracapacitors, and more specifically to a method and system modelling an ultracapacitor.

BACKGROUND

Ultracapacitors, also known as supercapacitors, are energy storage devices that have significantly higher capacitance values than typical capacitors. Ultracapacitors are increasingly being utilized in various applications, such as electric vehicles (EVs), energy storage systems, and Industrial Internet of Things (IIoT) devices. It is to be noted that even ultracapacitors with the same nominal capacitance value can exhibit significant performance variation due to differences in their internal chemistry. Ultracapacitors are produced using a variety of materials and manufacturing processes, leading to differences in their physical and electrochemical properties. These differences can impact key performance parameters such as equivalent series resistance (ESR), specific energy, specific power, and behaviour of the ultracapacitor over its lifespan.

Given their increasing prevalence, there is a growing need to accurately model the behaviour of a given ultracapacitor. Accurate modelling aids in predicting performance of the given ultracapacitor across different operating conditions and frequency ranges, thereby enabling more efficient design and use of devices that incorporate such given ultracapacitor. However, generating a model for the given ultracapacitor presents a significant challenge, particularly when dealing with ultracapacitors of lower capacitance values and when using less sophisticated, lower-end measurement equipment. Existing methods for ultracapacitor modelling often use RC ladder model (as proposed by Zubieta et al. in their paper published in IEEE Transaction on Industry Applications (vol 36, No. 1, January/February 2000)). However, these methods typically use a mix of heuristics and physics of the circuit for parameter estimation, and heavily relies on data from multiple experiments, making the process often inaccurate and complex, particularly when applied to lower capacitance ultracapacitors in the range of 1-25 farad (F), for example.

In light of the above, there remains a need for accurately estimating the parameters of an ultracapacitor model, particularly for lower capacitance values, using less robust apparatus, while overcoming the limitations of existing solutions, providing a more efficient and practical approach to ultracapacitor modelling.

Embodiments of the present invention propose a method and a system for accurately modelling and parameterizing ultracapacitors, especially those of lower capacitance values, using an accessible and cost-effective setup. Embodiments of the present invention uniquely combines hardware apparatus and software algorithms to overcome the limitations of current methods, yielding a robust estimation of the model parameters through optimization techniques applied sectionally to the problem.

The aspect of embodiments of the present invention is achieved by a method for modelling an ultracapacitor. The method comprises obtaining, from a capacitor modelling apparatus, at least one measured charge-discharge plot for a given ultracapacitor to be modelled, wherein the capacitor modelling apparatus generates the at least one measured charge-discharge plot by providing one or more constant currents and/or one or more constant voltages to one or more of the given ultracapacitors utilized therein. The method further comprises generating, in a simulation platform, at least one simulated charge-discharge plot by using same values for the one or more constant currents and/or the one or more constant voltages in a circuit model with an initial set of values for simulated capacitors and simulated resistors in a Resistor-Capacitor (RC) ladder based electrical equivalent circuit model configured to approximate behaviour of the given ultracapacitor therein. The method further comprises optimizing by changing the initial set of values to converge the at least one simulated charge-discharge plot to the at least one measured charge-discharge plot. The method further comprises determining a final set of values for the simulated capacitors and the simulated resistors in the RC ladder based electrical equivalent circuit model of the given ultracapacitor based on the at least one simulated charge-discharge plot substantially converging to the at least one measured charge-discharge plot.

The present method allows for an accurate representation of the ultracapacitor's behaviour by correlating measured and simulated charge-discharge plots. The method uses a capacitor modelling apparatus to obtain at least one measured charge-discharge plot and a simulation platform to generate corresponding simulated plots. By adjusting the initial set of values in an RC ladder-based electrical equivalent circuit model, the simulated plot is made to converge with the measured one. This alignment leads to a final set of values for the simulated capacitors and resistors in the model, thus providing an optimized, accurate model of the ultracapacitor.

In one or more embodiments, the RC ladder based electrical equivalent circuit model of the given ultracapacitor is defined with multiple RC branches connected in parallel, with each one of the multiple RC branches comprising one or more of the simulated capacitors disposed in series with one or more of the simulated resistors, and wherein the optimization is performed by steps of: (i) constraining to estimate a first set of intermediate values for the one or more of the simulated capacitors and the one or more of the simulated resistors for an immediate branch of the multiple RC branches at a given instance; (ii) repeating the step (i) to estimate a final set of intermediate values for the one or more of the simulated capacitors and the one or more of the simulated resistors for the immediate branch until the at least one simulated charge-discharge plot therefor substantially converges with the corresponding at least one measured charge-discharge plot; (iii) constraining, using the final set of intermediate values for the one or more of the simulated capacitors and the one or more of the simulated resistors for the immediate branch, to estimate a first set of intermediate values for the one or more of the simulated capacitors and the one or more of the simulated resistors for next branches, to the immediate branch, of the multiple RC branches at a given instance; (iv) repeating the step (iii) to estimate a final set of intermediate values for the one or more of the simulated capacitors and the one or more of the simulated resistors for the next branches until the at least one simulated charge-discharge plot therefor converges with the corresponding at least one measured charge-discharge plot; and (v) repeating the steps (i)-(iv) to determine the final set of values for the simulated capacitors and the simulated resistors in the RC ladder based electrical equivalent circuit model of the given ultracapacitor.

The RC ladder-based electrical equivalent circuit model is designed with multiple RC branches, each consisting of simulated capacitors and resistors in parallel. The optimization is conducted through a systematic, iterative process of estimation and reassessment for each branch, using the convergence of the simulated and measured charge-discharge plots as the guiding metric. This approach allows for a stepwise refinement of the model, thereby ensuring that the final set of values for the simulated capacitors and resistors closely represent the real-world performance of the ultracapacitor.

In one or more embodiments, the RC ladder based electrical equivalent circuit model of the given ultracapacitor is further defined with a discharge resistor disposed in a last branch of the multiple RC branches. Herein, the method comprises allowing the given ultracapacitor to discharge in the capacitor modelling apparatus. The method further comprises measuring a discharge rate for the given ultracapacitor while discharging in the capacitor modelling apparatus. The method further comprises determining a value for the discharge resistor based on the measured discharge rate for the given ultracapacitor.

Herein, the RC ladder-based electrical equivalent circuit model is further enhanced by incorporating the discharge resistor in the last branch of the multiple RC branches. The method includes allowing the ultracapacitor to discharge in the modelling apparatus, measuring the discharge rate, and subsequently determining the value of the discharge resistor based on this measured discharge rate. This approach enhances the accuracy of the model for the discharge phase of the ultracapacitor for real-world performance characteristics.

In one or more embodiments, the method further comprises establishing an offset for the capacitor modelling apparatus employing an analog-to-digital converter (ADC). Herein, the method comprises sampling a baseline signal for the capacitor modelling apparatus without injecting signal therein. The method further comprises sampling ADC signal by injecting a predefined signal in the capacitor modelling apparatus, wherein the predefined signal is known to be used by the ADC and unused by the given ultracapacitor. The method further comprises establishing the offset based on the sampled baseline signal and the sampled ADC signal.

Herein, the method further increases the accuracy of the ultracapacitor modelling by establishing the offset for the capacitor modelling apparatus which employs the analog-to-digital converter (ADC), by considering baseline signal (noise) therein.

In one or more embodiments, the method further comprises adjusting the at least one measured charge-discharge plot based on the established offset, prior to using the at least one measured charge-discharge plot for convergence with the at least one simulated charge-discharge plot.

This approach of using the offset enhances the measurement accuracy of the modelling apparatus, thereby providing a more precise and trustworthy simulation of behaviour of the ultracapacitor. This higher level of accuracy may lead to more reliable predictions and optimizations in systems that employ ultracapacitors.

In one or more embodiments, the method further comprises processing the at least one measured charge-discharge plot by implementing one or more of a moving average filter technique and a wavelet based denoising technique.

Herein, the moving average filter helps smooth out short-term fluctuations and highlight longer-term trends or cycles, whereas the wavelet-based denoising technique provides an effective tool for eliminating noise while preserving the essential features of the signal. These techniques contribute to reducing noise and outliers in the measured data, which in turn increases the reliability of the ultracapacitor model.

SUMMARY

The aspect of embodiments of the present invention is also achieved by a system for modelling an ultracapacitor. The system comprises a capacitor modelling apparatus. The capacitor modelling apparatus comprises one or more test circuits, with each of the one or more test circuits comprising a given ultracapacitor to be modelled, and a programmable electric source electrically connected in series to the given ultracapacitor and configured to provide a constant current and/or a constant voltage thereto. The capacitor modelling further apparatus a controller in signal communication with the one or more test circuits. Herein, the controller is configured to program the programmable electric source to provide one or more constant currents and/or one or more constant voltages to the corresponding given ultracapacitor for each of the one or more test circuits, to generate at least one measured charge-discharge plot for the given ultracapacitor. The system further comprises a simulation platform provided with a circuit model having a Resistor-Capacitor (RC) ladder based electrical equivalent circuit model configured to approximate behaviour of the given ultracapacitor. The simulation platform is configured to generate at least one simulated charge-discharge plot by using same values for the one or more constant currents and/or the one or more constant voltages in the circuit model with an initial set of values for simulated capacitors and simulated resistors in the RC ladder based electrical equivalent circuit model of the given ultracapacitor. The system further comprises a processor configured to optimize by changing the initial set of values to converge the at least one simulated charge-discharge plot to the at least one measured charge-discharge plot; and determine a final set of values for the simulated capacitors and the simulated resistors in the RC ladder based electrical equivalent circuit model of the given ultracapacitor based on the at least one simulated charge-discharge plot substantially converging to the at least one measured charge-discharge plot.

The present system for modelling the ultracapacitor provides advantages in automation, precision, and cost-effectiveness. The modelling apparatus, equipped with programmable electric sources and test circuits, generates charge-discharge plots for ultracapacitors. The simulation platform, employing the RC ladder-based circuit model, replicates the behaviour of the ultracapacitor. The processor optimizes the model by aligning simulated charge-discharge plots with the measured plots, thereby determining the final values for the model. This process enables high precision in model generation, while automation minimizes human intervention, saving time and reducing errors.

In one or more embodiments, the RC ladder based electrical equivalent circuit model of the given ultracapacitor is defined with multiple RC branches connected in parallel, with each one of the multiple RC branches comprising one or more of the simulated capacitors disposed in series with one or more of the simulated resistors. Herein, the processor is configured to perform the optimization by steps of: (i) constraining to estimate a first set of intermediate values for the one or more of the simulated capacitors and the one or more of the simulated resistors for an immediate branch of the multiple RC branches at a given instance; (ii) repeating the step (i) to estimate a final set of intermediate values for the one or more of the simulated capacitors and the one or more of the simulated resistors for the immediate branch until the at least one simulated charge-discharge plot therefor substantially converges with the corresponding at least one measured charge-discharge plot; (iii) constraining, using the final set of intermediate values for the one or more of the simulated capacitors and the one or more of the simulated resistors for the immediate branch, to estimate a first set of intermediate values for the one or more of the simulated capacitors and the one or more of the simulated resistors for next branches, to the immediate branch, of the multiple RC branches at a given instance; (iv) repeating the step (iii) to estimate a final set of intermediate values for the one or more of the simulated capacitors and the one or more of the simulated resistors for the next branches until the at least one simulated charge-discharge plot therefor converges with the corresponding at least one measured charge-discharge plot; and (v) repeating the steps (i)-(iv) to determine the final set of values for the simulated capacitors and the simulated resistors in the RC ladder based electrical equivalent circuit model of the given ultracapacitor.

The RC ladder-based electrical equivalent circuit model is designed with multiple RC branches, each consisting of simulated capacitors and resistors in parallel. The optimization is conducted through a systematic, iterative process of estimation and reassessment for each branch, using the convergence of the simulated and measured charge-discharge plots as the guiding metric. This approach allows for a stepwise refinement of the model, thereby ensuring that the final set of values for the simulated capacitors and resistors closely represent the real-world performance of the ultracapacitor.

In one or more embodiments, the RC ladder based electrical equivalent circuit model of the given ultracapacitor is further defined with a discharge resistor disposed in a last branch of the multiple RC branches. Herein, the controller, in the capacitor modelling apparatus, is further configured to: allow the given ultracapacitor to discharge in the capacitor modelling apparatus; and measure a discharge rate for the given ultracapacitor while discharging in the capacitor modelling apparatus. Further, the processor is configured to determine a value for the discharge resistor based on the measured discharge rate for the given ultracapacitor.

Herein, the RC ladder-based electrical equivalent circuit model is further enhanced by incorporating the discharge resistor in the last branch of the multiple RC branches. The method includes allowing the ultracapacitor to discharge in the modelling apparatus, measuring the discharge rate, and subsequently determining the value of the discharge resistor based on this measured discharge rate. This approach enhances the accuracy of the model for the discharge phase of the ultracapacitor for real-world performance characteristics.

In one or more embodiments, the capacitor modelling apparatus comprises an array of test circuits disposed in parallel to each other, with each of the array of test circuits comprising a switch. Herein, the controller is configured to: activate one of the array of test circuits at a given instant by regulating the corresponding switch to closed position thereof; and provide the one or more constant currents and/or the one or more constant voltages to the given ultracapacitor of the activated one of the array of test circuits to generate the at least one measured charge-discharge plot therefor.

This setup offers the advantage of concurrent testing using multiple instances of the given ultracapacitor, which may then be averaged, improving the reliability and efficiency of the modelling process. The ability to handle multiple ultracapacitors simultaneously widens the scope of experimentation and improves the accuracy and flexibility of ultracapacitor modelling, thus further optimizing the overall modelling process.

In one or more embodiments, the controller is configured to program each one of the programmable electric sources in the array of test circuits to provide same constant current to the corresponding given ultracapacitors and/or different constant currents to the different given ultracapacitors, to generate a set of measured charge-discharge plots for the given ultracapacitors. Further, the controller is configured to compute an average of the set of measured charge-discharge plots to obtain the at least one measured charge-discharge plot.

This flexibility allows the generation of a range of measured charge-discharge plots for the given ultracapacitors. The controller can then calculate an average of these plots to derive a single, representative measured charge-discharge plot. The ability to manage and average multiple plots ensures greater precision and accuracy in the modelling process, mitigating the potential for discrepancies or outliers in the data and ultimately leading to more accurate and reliable ultracapacitor models.

In one or more embodiments, the capacitor modelling apparatus comprises at least three test circuits in the array of test circuits.

That is, the capacitor modelling apparatus includes a minimum of three test circuits within the array. This configuration strikes an ideal balance, providing a level of redundancy and variance in the data without overly complicating the system or excessively increasing the cost or complexity of data analysis.

In one or more embodiments, the one or more constant currents and/or one or more constant voltages are defined based on a rated capacity of the given ultracapacitor.

This configuration ensures that the charge and discharge conditions are tailored to the specifications of each individual ultracapacitor, increasing the reliability and accuracy of the modelling process. This also enables a safer operation by avoiding potential overcharging or excessive discharge that could harm the ultracapacitor or skew the collected data.

In one or more embodiments, the controller is a microprocessor with a built-in analog-to-digital converter (ADC) with multiplexed channels.

This configuration enables simultaneous and efficient processing of multiple signals from different channels, allowing for more comprehensive and timely data collection and analysis. This capability may enhance the accuracy of the ultracapacitor model by capturing more details of behaviour of the ultracapacitor under various conditions.

In one or more embodiments, the capacitor modelling apparatus further comprises a temperature sensor configured to measure a temperature value for components of the capacitor modelling apparatus. The capacitor modelling apparatus further comprises a heat management unit in signal communication with the temperature sensor to receive the measured temperature value therefrom, wherein the heat management unit is configured to regulate heating and/or cooling to maintain a substantially constant temperature for the components of the capacitor modelling apparatus by implementing a feedback loop based on the measured temperature value.

The inclusion of the temperature sensor and the heat management unit in the capacitor modelling apparatus ensures a consistent operating environment for the apparatus, which leads to more accurate and repeatable measurements of the ultracapacitor's charge-discharge behaviour. Additionally, this safeguards the components of the apparatus against damage from overheating, thereby enhancing the longevity and reliability of the system.

Still other aspects, features, and advantages of embodiments of the invention are readily apparent from the following detailed description, simply by illustrating a number of particular embodiments and implementations, including the best mode contemplated for carrying out embodiments of the invention. Embodiments of the invention are also capable of other and different embodiments, and its several details may be modified in various obvious respects, all without departing from the scope of embodiments of the invention. Accordingly, the drawings and description are to be regarded as illustrative in nature, and not as restrictive.

BRIEF DESCRIPTION

A more complete appreciation of embodiments of the present invention and many of the attendant aspects thereof will be readily obtained as the same becomes better understood by reference to the following description when considered in connection with the accompanying drawings.

Figure 8A:
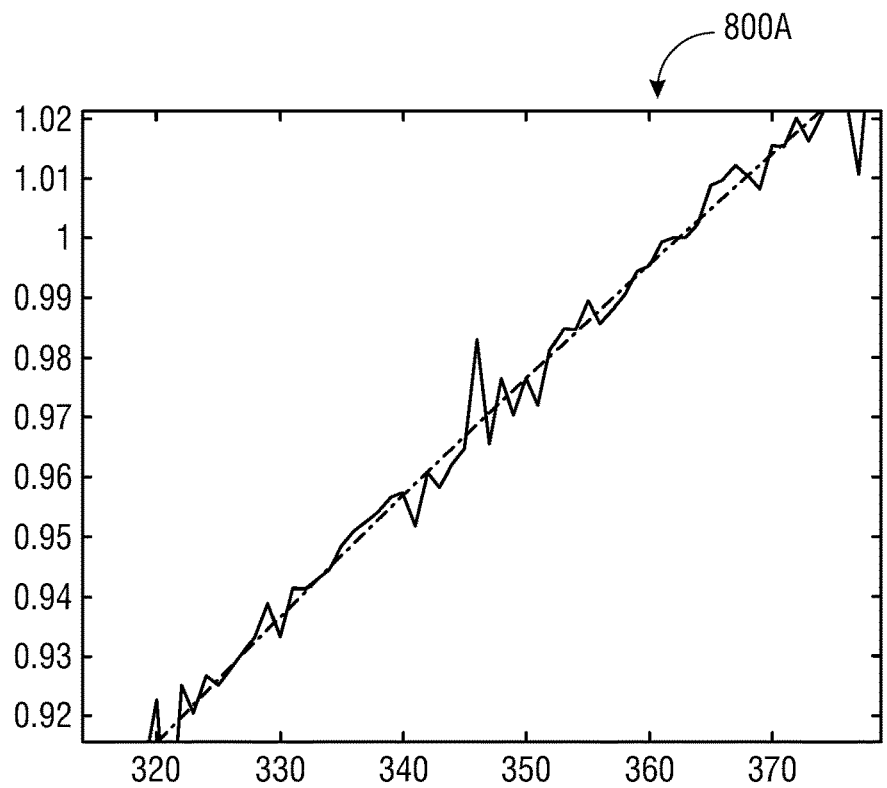
Figure 8B:
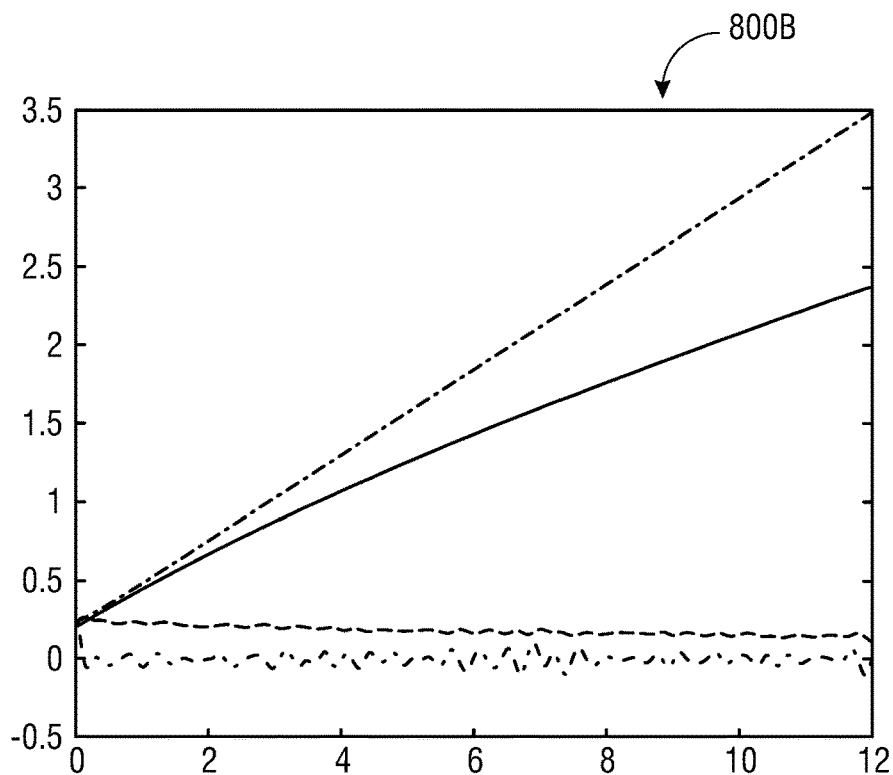
Figure 8C:
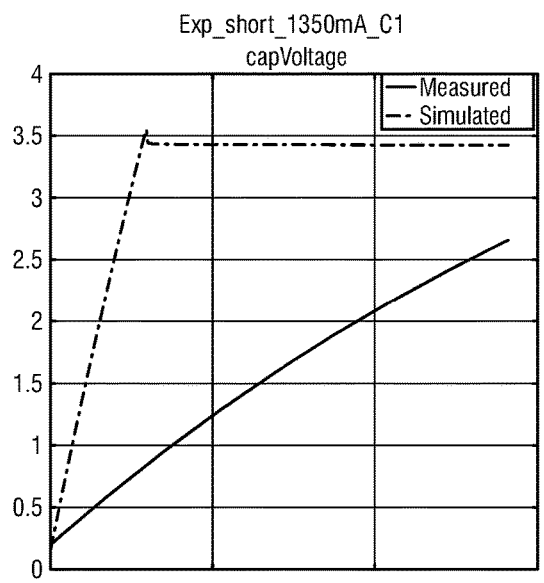
Figure 8D:
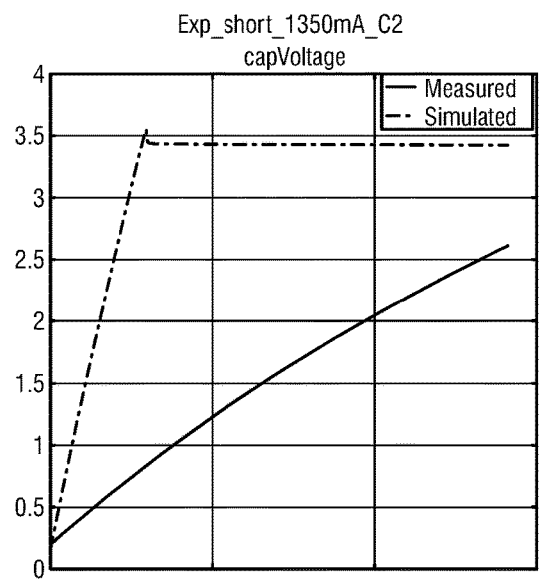
Figure 8E:
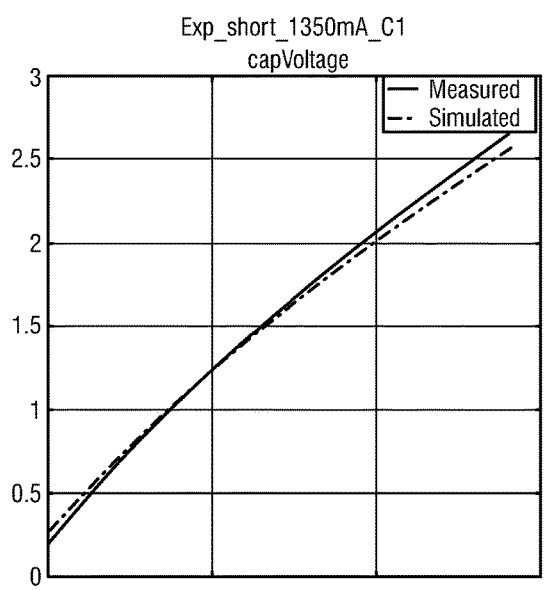
Figure 8F:
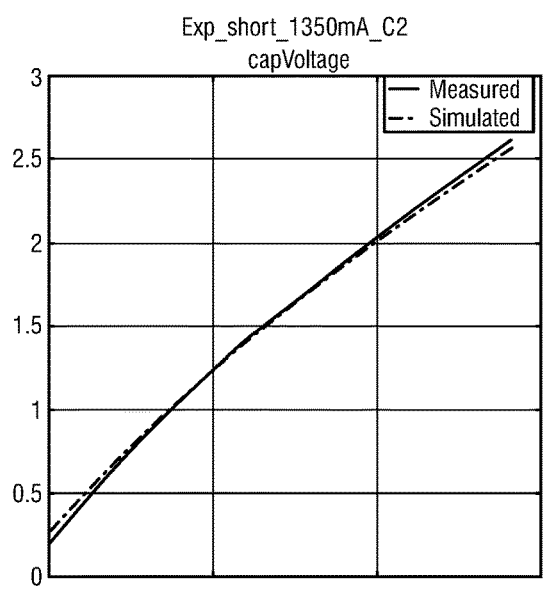
Figure 8G:
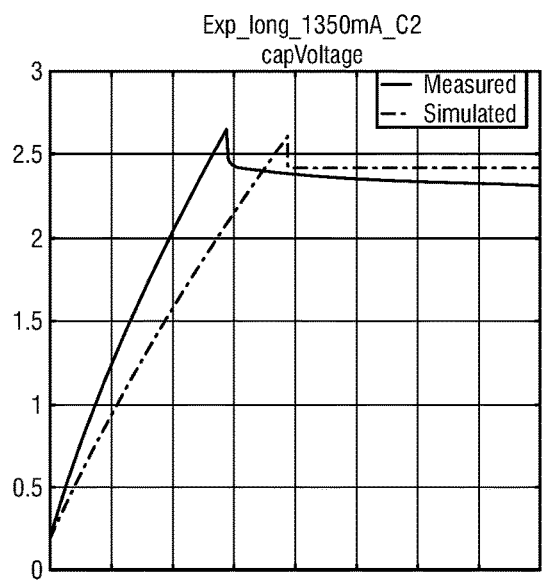
Figure 8H:
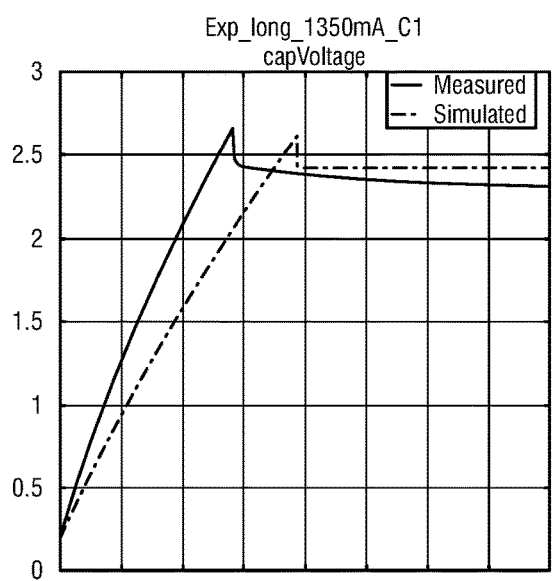
Figure 8I:
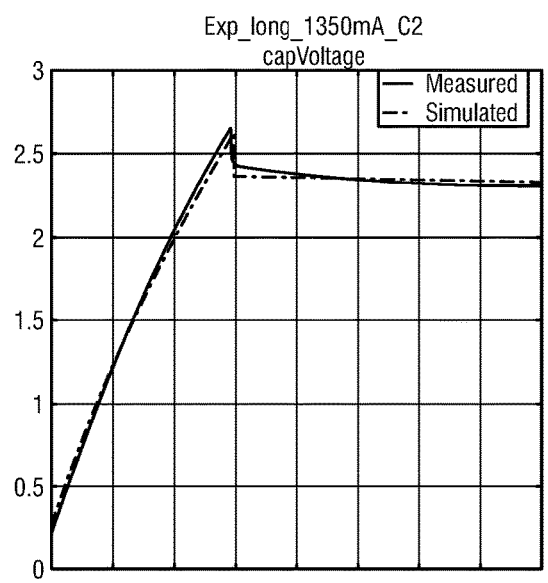
Figure 8J:
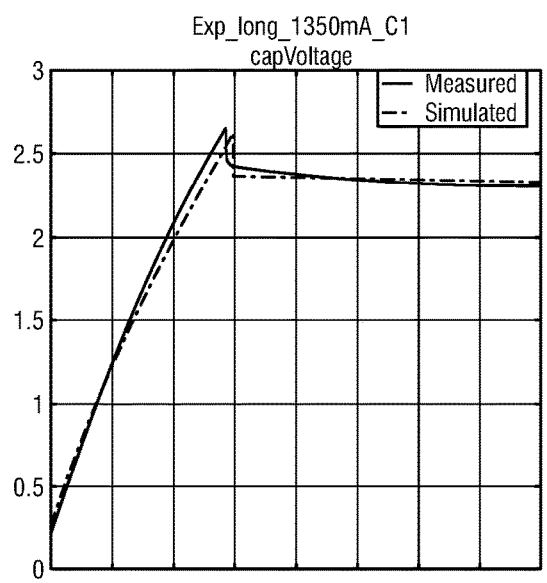

FIG. 8A depicts a graph providing one or more of simulated charge-discharge plot and measured charge-discharge plot at a stage involved in the optimization process, in accordance with one or more embodiments of the present invention FIG. 8B depicts a graph providing one or more of simulated charge-discharge plot and measured charge-discharge plot at a stage involved in the optimization process, in accordance with one or more embodiments of the present invention;

FIG. 8C depicts a graph providing one or more of simulated charge-discharge plot and measured charge-discharge plot at a stage involved in the optimization process, in accordance with one or more embodiments of the present invention;

FIG. 8D depicts a graph providing one or more of simulated charge-discharge plot and measured charge-discharge plot at a stage involved in the optimization process, in accordance with one or more embodiments of the present invention;

FIG. 8E depicts a graph providing one or more of simulated charge-discharge plot and measured charge-discharge plot at a stage involved in the optimization process, in accordance with one or more embodiments of the present invention;

FIG. 8F depicts a graph providing one or more of simulated charge-discharge plot and measured charge-discharge plot at a stage involved in the optimization process, in accordance with one or more embodiments of the present invention;

FIG. 8G depicts a graph providing one or more of simulated charge-discharge plot and measured charge-discharge plot at a stage involved in the optimization process, in accordance with one or more embodiments of the present invention;

FIG. 8H depicts a graph providing one or more of simulated charge-discharge plot and measured charge-discharge plot at a stage involved in the optimization process, in accordance with one or more embodiments of the present invention;

FIG. 8I depicts a graph providing one or more of simulated charge-discharge plot and measured charge-discharge plot at a stage involved in the optimization process, in accordance with one or more embodiments of the present invention; and FIG. 8J depicts a graph providing one or more of simulated charge-discharge plot and measured charge-discharge plot at a stage involved in the optimization process, in accordance with one or more embodiments of the present invention.

DETAILED DESCRIPTION

Various embodiments are described with reference to the drawings, wherein like reference numerals are used to refer to like elements throughout. In the following description, for the purpose of explanation, numerous specific details are set forth in order to provide thorough understanding of one or more embodiments. It may be evident that such embodiments may be practiced without these specific details.

Examples of a method and a system for modelling an ultracapacitor are disclosed herein. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Figure 1:
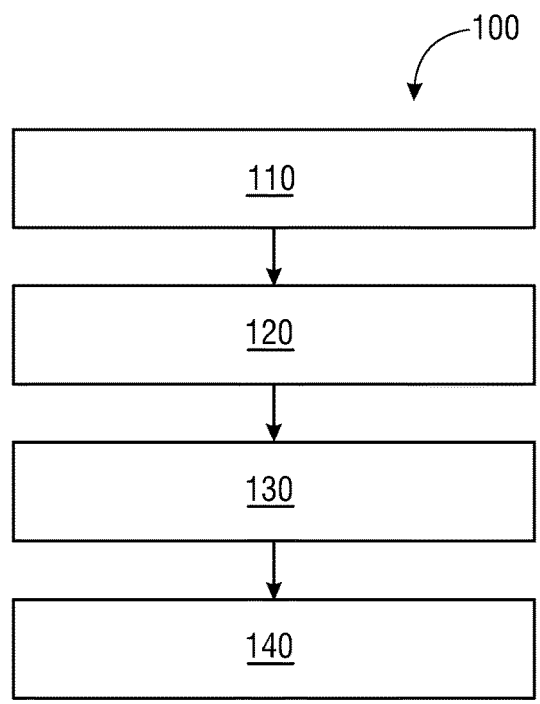
FIG. 1 is a flowchart representation of a method for modelling an ultracapacitor, in accordance with one or more embodiments of the present invention.

Referring now to FIG. 1, illustrated is a flowchart of a method (as represented by reference numeral 100) for modelling an ultracapacitor, in accordance with an embodiment of the present invention. Modelling a given ultracapacitor, in the context of embodiments of the present invention, refers to the process of developing an accurate and practical representation of behaviour of an ultracapacitor using an electrical equivalent circuit model. In other words, modelling the given ultracapacitor involves a systematic process for creating an accurate, robust, and practically useful representation of characteristics and behaviour of the given ultracapacitor. This process is achieved using a Resistor-Capacitor (RC) ladder-based electrical equivalent circuit model configured to approximate behaviour of the given ultracapacitor. It may be appreciated by a person skilled in the art that the RC ladder-based model is a well-known circuit configuration used in electronic systems to mimic the behaviour of complex systems like ultracapacitors.

Figure 2:
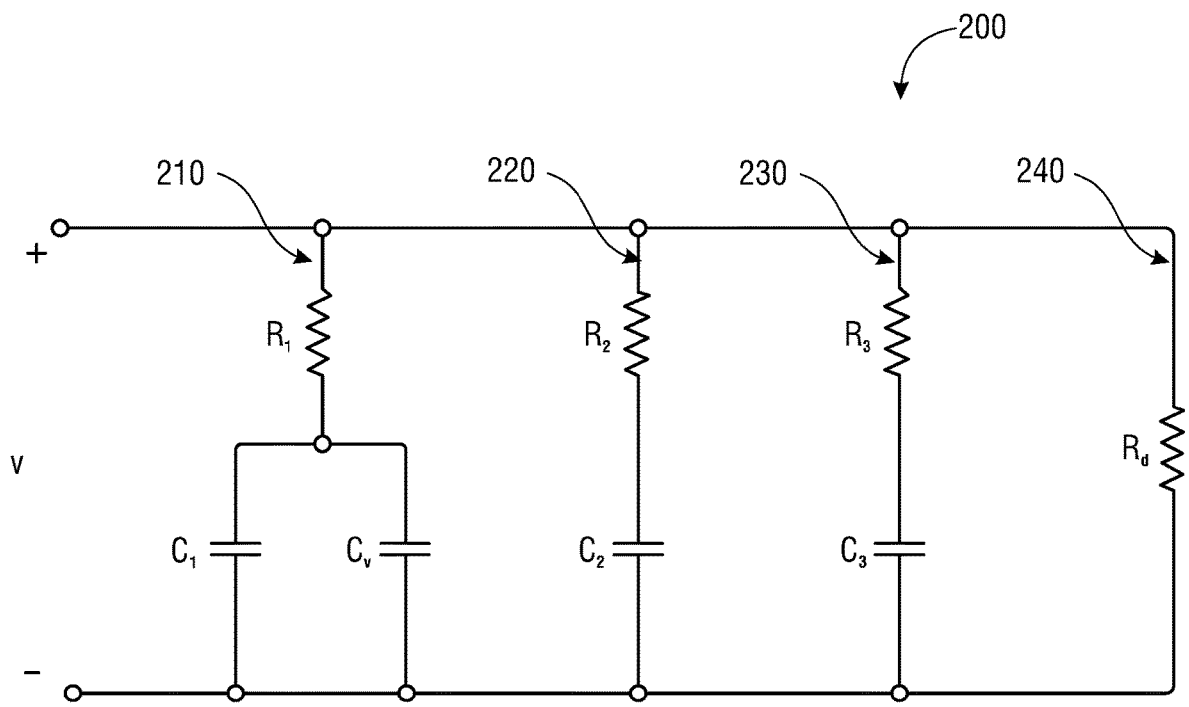
FIG. 2 is a schematic diagram representation of an exemplary Resistor-Capacitor (RC) ladder based electrical equivalent circuit model to approximate behaviour of an ultracapacitor, in accordance with one or more embodiments of the present invention.

FIG. 2 is a schematic diagram representation of an exemplary Resistor-Capacitor (RC) ladder based electrical equivalent circuit model (as referred by reference numeral 200) to approximate behaviour of an ultracapacitor. In the present RC ladder based electrical equivalent circuit model 200, the ultracapacitor is represented by a network of simulated resistors and capacitors arranged in multiple branches, with each branch having one or more of these simulated components. In particular, the RC ladder based electrical equivalent circuit model 200 of the given ultracapacitor is defined with multiple RC branches connected in parallel, with each one of the multiple RC branches including one or more of the simulated capacitors disposed in series with one or more of the simulated resistors. Each RC branch represents a different time constant of the ultracapacitor, mimicking its varying response over time and frequency. This architecture allows for the RC ladder based electrical equivalent circuit model 200 of the given ultracapacitor to be implemented in simulation tools by using a corresponding set of values for the simulated capacitors and the simulated resistors in the RC ladder based electrical equivalent circuit model 200 of the given ultracapacitor.

Herein, the number of RC branches, as well as the configuration, depends on the specific characteristics and requirements of the ultracapacitor being modelled. In the present example, the RC ladder based electrical equivalent circuit model 200 is shown to include an immediate branch 210 with a resistance '$R_1$', a capacitance '$C_1$', and a capacitance '$C_v$' which is a voltage dependent capacitor. Also, as illustrated, the RC ladder based electrical equivalent circuit model 200 includes a delayed branch 220 with a resistance '$R_2$' and a capacitance '$C_2$', and a long-term branch 230 with a resistance '$R_3$' and a capacitance '$C_3$'. Further, as illustrated, the RC ladder based electrical equivalent circuit model 200 is further defined with a discharge resistance '$R_a$' disposed in a last branch 240 thereof. It may be appreciated that, although the RC ladder based electrical equivalent circuit model 200 of the given ultracapacitor is shown to include only one of the delayed branch 220 and one of the long-term branch 230, the RC ladder based electrical equivalent circuit model 200 may include more than one number of such branches without departing from the spirit and the scope of embodiments of the present invention.

Figure 3:
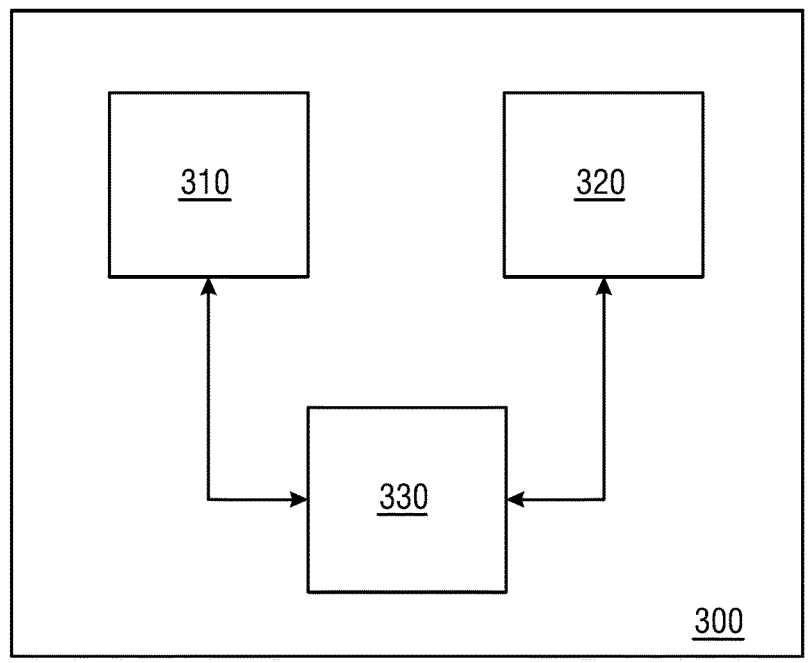
FIG. 3 is a block diagram representation of a system for modelling an ultracapacitor, in accordance with one or more embodiments of the present invention.

Referring to FIG. 3, illustrated is a block diagram of a system 300 for modelling an ultracapacitor, in accordance with one or more embodiments of the present invention. The system 300 encompasses an architecture specifically designed for accurately representing behaviour of an ultracapacitor. The system 300 includes three primary, interconnected components, each serving a distinct function, yet collectively contributing to the overall objective of modelling an ultracapacitor, including a capacitor modelling apparatus 310, a simulation platform 320 and a processor 330. The capacitor modelling apparatus 310 is the physical hardware segment of the system 300, with its principal function being to generate real-world data on the behaviour of the ultracapacitor under specific operational conditions. The capacitor modelling apparatus 310 conducts a series of controlled charge-discharge cycles on the ultracapacitor and records the corresponding electrical characteristics, resulting in a measured charge-discharge plot. This plot serves as a reference point against which the system 300 may compare simulated data for optimization. The simulation platform 320 is software-based and is designed to virtually emulate the behaviour of an ultracapacitor based on the selected electrical equivalent circuit model, such as the RC ladder based electrical equivalent circuit model 200. The simulation platform 320 generates a simulated charge-discharge plot based on an initial set of values for the parameters in the selected electrical equivalent circuit model. These values are adjustable and serve as the primary variables in the optimization process. The processor 330 is programmed to compare the measured charge-discharge plot from the capacitor modelling apparatus 310 with the simulated charge-discharge plot from the simulation platform 320. Based on this comparison, the processor 330 iteratively adjusts the parameter values in the simulation platform 320 until the simulated charge-discharge plot aligns as closely as possible with the measured charge-discharge plot, indicating that the selected electrical equivalent circuit model accurately represents the behaviour of the ultracapacitor. In some embodiments, as shown, the processor 330 may be disposed in signal communication with the capacitor modelling apparatus 310 and the simulation platform 320 to automatically obtain respective plots therefrom.

Figure 4:
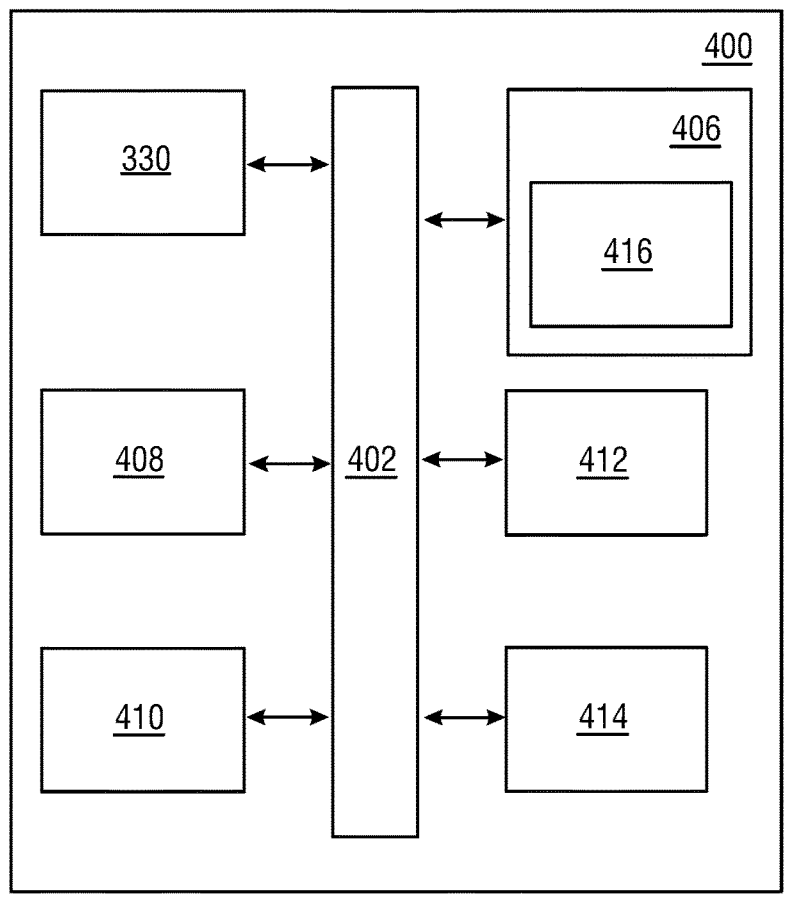
FIG. 4 is a schematic diagram representation of a computing unit having a processor implemented for performing steps involved in modelling an ultracapacitor, in accordance with one or more embodiments of the present invention.

Referring to FIG. 4, illustrated is a block diagram of a computing unit 400 which may incorporate and provide the processor 330 for implementation in the system 300, in accordance with one or more embodiments of the present invention. Generally, as used herein, the term "processor" refers to a computational element that is operable to respond to and processes instructions that drive the computing unit 400. Optionally, the processor includes, but is not limited to, a microprocessor, a microcontroller, a complex instruction set computing (CISC) microprocessor, a reduced instruction set (RISC) microprocessor, a very long instruction word (VLIW) microprocessor, or any other type of processing circuit. Furthermore, the term "processor" may refer to one or more individual processors, processing devices and various elements associated with a processing device that may be shared by other processing devices. Additionally, the one or more individual processors, processing devices and elements are arranged in various architectures for responding to and processing the instructions that drive the computing unit 400.

It may be appreciated that the computing unit 400 described herein may be implemented in various forms of hardware, software, firmware, special purpose processors, or a combination thereof. One or more of the present embodiments may take a form of a computer program product (non-transitory computer readable storage medium having instructions, which when executed by a processor, perform actions) comprising program modules accessible from computer-usable or computer-readable medium storing program code for use by or in connection with one or more computers, processors, or instruction execution system. For the purpose of this description, a computer-usable or computer-readable medium may be any apparatus that may contain, store, communicate, propagate, or transport the program for use by or in connection with the instruction execution system, apparatus, or device. The medium may be electronic, magnetic, optical, electromagnetic, infrared, or semiconductor system (or apparatus or device) or a propagation mediums in and of themselves as signal carriers are not included in the definition of physical computer-readable medium include a semiconductor or solid state memory, magnetic tape, a removable computer diskette, random access memory (RAM), a read only memory (ROM), a rigid magnetic disk and optical disk such as compact disk read-only memory (CD-ROM), compact disk read/write, and digital versatile disc (DVD). Both processors and program code for implementing each aspect of the technology may be centralized or distributed (or a combination thereof) as known to those skilled in the art.

In an example, the computing unit 400 may be embodied as a computer-program product 400 programmed for performing the said purpose. The computing unit 400 may be incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the computing unit 400 may be implemented in a single chip. As illustrated, the computing unit 400 includes a communication mechanism such as a bus 402 for passing information among the components of the computing unit 400. The computing unit 400 includes a memory 406 communicatively coupled to the processor 330. In an example, the memory 406 may be embodied as a computer readable medium on which program code sections of a computer program are saved, the program code sections being loadable into and/or executable in a system to make the computing unit 400 execute the steps for performing the said purpose.

Herein, the memory 406 may be volatile memory and/or non-volatile memory. The memory 406 may be coupled for communication with the processor 330. The processor 330 may execute instructions and/or code stored in the memory 406. A variety of computer-readable storage media may be stored in and accessed from the memory 406. The memory 406 may include any suitable elements for storing data and machine-readable instructions, such as read only memory, random access memory, erasable programmable read only memory, electrically erasable programmable read only memory, a hard drive, a removable media drive for handling compact disks, digital video disks, diskettes, magnetic tape cartridges, memory cards, and the like.

In particular, the processor 330 has connectivity to the bus 402 to execute instructions and process information stored in the memory 406. The processor 330 may include one or more processing cores with each core configured to perform independently. A multi-core processor enables multiprocessing within a single physical package. Examples of a multi-core processor include two, four, eight, or greater numbers of processing cores. Alternatively, or in addition, the processor 330 may include one or more microprocessors configured in tandem via the bus 402 to enable independent execution of instructions, pipelining, and multithreading. The processor 330 may also be accompanied with one or more specialized components to perform certain processing functions and tasks such as one or more digital signal processors (DSP), and/or one or more application-specific integrated circuits (ASIC). Other specialized components to aid in performing the inventive functions described herein include one or more field programmable gate arrays (FPGA) (not shown), one or more controllers (not shown), or one or more other special-purpose computer chips.

The computing unit 400 may further include a communication interface 408 which may enable the computing unit 400 to communicate with other systems for receiving and transmitting information. The communication interface 408 may include a medium (e.g., a communication channel) through which the computing unit 400 communicates with other system. Examples of the communication interface 408 may include, but are not limited to, a communication channel in a computer cluster, a Local Area Communication channel (LAN), a cellular communication channel, a wireless sensor communication channel (WSN), a cloud communication channel, a Metropolitan Area Communication channel (MAN), and/or the Internet. Optionally, the communication interface 408 may include one or more of a wired connection, a wireless network, cellular networks such as 4G, 3G, 4G, 5G mobile networks, and a Zigbee connection.

The computing unit 400 also includes a database 410. As used herein, the database 410 is an organized collection of structured data, typically stored in a computer system and designed to be easily accessed, managed, and updated. The database 410 may be in form of a central repository of information that can be queried, analysed, and processed to support various applications and business processes. In the computing unit 400, the database 410 provides mechanisms for storing, retrieving, updating, and deleting data, and typically includes features such as data validation, security, backup and recovery, and data modelling.

The computing unit 400 further includes an input device 412 and an output device 414. The input device 412 may take various forms depending on the specific application of the computing unit 400. In an example, the input device 412 may include one or more of a keyboard, a mouse, a touchscreen display, a microphone, a camera, or any other hardware component that enables the user to interact with the computing unit 400. Further, the output device 414 may be in the form of a display. It is to be understood that, when reference is made in embodiments of the present invention to the term "display" this refers generically either to a display screen on its own or to the screen and an associated housing, drive circuitry and possibly a physical supporting structure, of which all, or part of is provided for displaying information.

In the present computing unit 400, the processor 330 and accompanying components have connectivity to the memory 406 via the bus 402. The memory 406 includes both dynamic memory (e.g., RAM, magnetic disk, writable optical disk, etc.) and static memory (e.g., ROM, CD-ROM, etc.) for storing executable instructions that when executed perform steps of the method 100 described herein for modelling an ultracapacitor. In particular, the memory 406 includes a module arrangement 416 to perform the steps for modelling the ultracapacitor. Also, in the computing unit 400, the memory 406 may be configured to store the data associated with or generated by the execution of the said steps.

Figure 5:
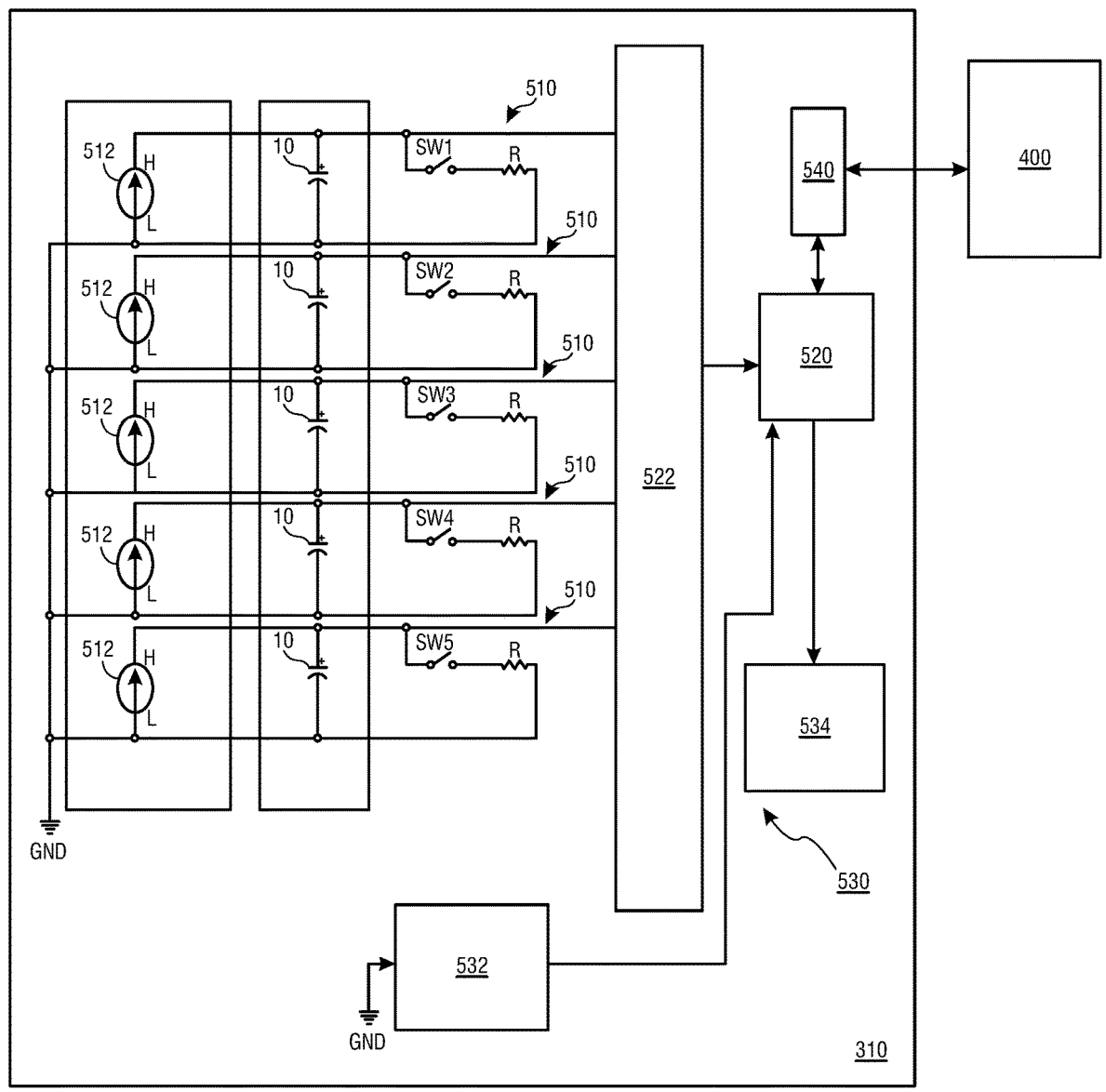
FIG. 5 is a circuit diagram representation of a capacitor modelling apparatus for approximating real-world behaviour of a given ultracapacitor, in connection with the computing unit, in accordance with one or more embodiments of the present invention.

Referring to FIG. 5, illustrated is a circuit diagram representation of the capacitor modelling apparatus 310 for approximating real-world behaviour of a given ultracapacitor, in connection with the computing unit 400, and thereby the processor 330, in accordance with one or more embodiments of the present invention. As illustrated, the capacitor modelling apparatus 310 includes one or more test circuits 510. In particular, the capacitor modelling apparatus 310 includes an array of test circuits 510 disposed in parallel to each other. Herein, each of the one or more test circuits 510 includes a given ultracapacitor (as represented by reference numeral 10) to be modelled. In embodiments of the present invention, the capacitor modelling apparatus comprises at least three test circuits 310 in the array of test circuits. In the illustrated example, the capacitor modelling apparatus 310 is shown to include five (5) test circuits 510. This allows the generation of a set of measured charge-discharge plots (as discussed later in more detail) for the given ultracapacitor 10, which may then be averaged to obtain a final, measured charge-discharge plot. It may be appreciated that higher the number of test circuits 510 with the given ultracapacitor 10 to be modelled, better be the comprehensiveness and accuracy of the modelling process; however higher will be the cost associated with the capacitor modelling apparatus 310, and thus a balanced approach may be taken, such as utilizing five (5) test circuits 510 as in the exemplary setup of the capacitor modelling apparatus 310.

As illustrated, each of the array of test circuits 510 includes a switch (shown as 'SW1-SW5') with a corresponding resistor 'R' which may allow to activate and deactivate the corresponding test circuit 510 as required. Also, each of the array of test circuits 510 includes a programmable electric source 512 electrically connected in series to the given ultracapacitor 10 and configured to provide a constant current and/or a constant voltage thereto. In an embodiment, the one or more constant currents and/or one or more constant voltages are defined based on a rated capacity of the given ultracapacitor 10. That is, the defined values for the one or more constant currents and/or the one or more constant voltages that are to be applied to the given ultracapacitor 10 are established based on the rated capacity thereof. As used herein, the "rated capacity" of an ultracapacitor is a measure of the maximum amount of electrical charge it can store, typically expressed in farads (F). This is an intrinsic characteristic of the ultracapacitor, determined by its design and material properties. Therefore, setting the constant current or voltage values based on the rated capacity of the given ultracapacitor 10 ensures that the testing conditions are pertinent and representative of the real-world scenarios the given ultracapacitor 10 may encounter in actual applications.

Further, the capacitor modelling apparatus 310 includes a controller 520 in signal communication with the one or more test circuits 510. In an embodiment, the controller 520 is a microprocessor with a built-in analog-to-digital converter (ADC) with multiplexed channels. An ADC is a device that converts the analog signals (continuous in nature) that the controller 520 receives from the various test circuits 510 into digital data that the controller 520 may understand and process. Thus, the inclusion of the built-in ADC within the microprocessor of the controller 520 helps in data acquisition and analysis. Also, the multiplexed channels enables efficient and simultaneous processing of multiple data types. Further, in an example, the controller 520 is a 32-bit microprocessor. In general, such 32-bit microprocessor may be able to handle larger amounts of data, as may be required for complex modelling tasks, such as modelling the behaviour of the given ultracapacitor 10. Also, as shown, the controller 520 may be interfacing with the test circuits 510 via a analog front end (AFE) 522 which may include a set of analog signal conditioning circuitry that prepares and optimizes real-world analog signals to be digitized and subsequently processed by the controller 520.

In the capacitor modelling apparatus 310, the controller 520 is configured to activate one of the array of test circuits 510 at a given instant by regulating the corresponding switch 'SW1-SW5' to closed position thereof. Further, the controller 520 is configured to provide the one or more constant currents and/or the one or more constant voltages to the given ultracapacitor 10 of the activated one of the array of test circuits to generate the at least one measured charge-discharge plot therefor. That is, the controller 520 activates one test circuit 510 at any given moment by controlling the corresponding switch 'SW1-SW5' to its closed position. The controller 520 is then expected to deliver the one or more constant currents and/or one or more constant voltages to the corresponding given ultracapacitor 10 of the activated test circuit 510. Herein, the controller 520 is configured to program the programmable electric source 512 to provide one or more constant currents and/or one or more constant voltages to the corresponding given ultracapacitor 10 for each of the one or more test circuits 510, to generate at least one measured charge-discharge plot for the given ultracapacitor 10. This programming involves provisioning one or more constant currents and/or one or more constant voltages to the given ultracapacitor 10 in each of the test circuits 510. This results in the generation of the measured charge-discharge plot for the given ultracapacitor 10. It may be appreciated that such charge-discharge plot is a time series plot based on values for voltage over time and current over time, and may also be referred to as Voltage-Current (VI) plot in some instances, without any limitations.

In an embodiment, the controller 520 is configured to program each one of the programmable electric sources 512 in the array of test circuits 510 to provide same constant current to the corresponding given ultracapacitors 10 and/or different constant currents to the different given ultracapacitors 10, to generate a set of measured charge-discharge plots for the given ultracapacitors 10. In other words, the controller 520 programs the programmable electric sources 512 to either deliver the same constant current to the corresponding given ultracapacitor 10 or different constant currents to different given ultracapacitors 10. For instance, the controller 520 may choose a random set of currents based on capacitance of the given ultracapacitor 10, between the minimum the hardware can support and maximum being the short circuit current that the given ultracapacitor 10 can tolerate. In the present example, the controller 520 may exercise the given ultracapacitor 10 with five different charging currents or with one charging current for all the five given ultracapacitors 10. In some examples, the controller 520 may also run a few checks to determine the suitability of the plugged given capacitors 10, such as remnant charge therein, and shall indicate any such issue. This flexibility allows the generation of a set of measured charge-discharge plots for the given ultracapacitor 10. Further, the controller 520 is configured to compute an average of the set of measured charge-discharge plots to obtain at least one measured charge-discharge plot. That is, the controller 520 computes the average of this set of measured charge-discharge plots, thereby obtaining the final, measured charge-discharge plot which may then be used for further analysis, as described later in the description.

In an embodiment, the capacitor modelling apparatus 310 further includes a heat management system (generally represented by reference numeral 530). Herein, the heat management system 530 includes a temperature sensor 532 configured to measure a temperature value for components (such as, the given ultracapacitor 10) of the capacitor modelling apparatus 310. In the present examples, the temperature sensor 532 may be any one of thermocouples, Resistance Temperature Detectors (RTDs), thermistors, Infrared (IR) temperature sensors, semiconductor temperature sensors, bimetallic temperature sensors, or the like without any limitations. The heat management system 530 further includes a heat management unit 534 in signal communication with the temperature sensor 532 to receive the measured temperature value therefrom. That is, the measured temperature value is relayed to the heat management unit 534. The heat management unit 534 is configured to regulate heating and/or cooling to maintain a substantially constant temperature for the components of the capacitor modelling apparatus 310 by implementing a feedback loop based on the measured temperature value. That is, the heat management unit 534, based on the received temperature value, regulates heating and/or cooling to maintain a substantially constant temperature for the components of the capacitor modelling apparatus 310, thereby ensuring consistent testing conditions and minimizing temperature-induced errors.

Further, as illustrated, the capacitor modelling apparatus 310 includes additional components to support the transfer of the measured charge-discharge plot for the given ultracapacitor 10 to the computing unit 400, and thereby the processor 330 therein. For this purpose, the capacitor modelling apparatus 310 may include a communication interface 540 in communication with the controller 520 to receive the measured charge-discharge plot. It may be contemplated that the communication interface 540 may include, but not limited to, a USB interface. Such interconnected network of components enables autonomous operation for the capacitor modelling apparatus 310. In an example, the capacitor modelling apparatus 310 and the processor 330 may be configured to collectively have the ability to autonomously discover the model parameters of the given ultracapacitor 10 that is being tested/modelled. This autonomous operation is particularly advantageous in the reduction of manual input, thereby decreasing the potential for errors during the modelling process of the given ultracapacitor 10.

Figure 6:
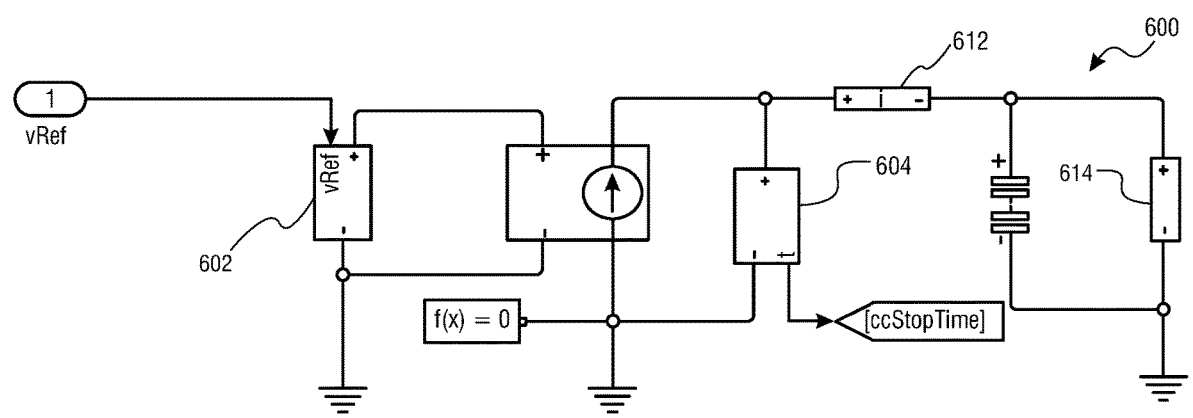
FIG. 6 is a circuit diagram representation of a circuit model as implemented in a simulation platform for approximating simulated behaviour of a given ultracapacitor, in accordance with one or more embodiments of the present invention.

Referring to FIG. 6, illustrated is a circuit diagram representation of a circuit model (as represented by reference numeral 600) as implemented in the simulation platform 320 for approximating simulated behaviour of the given ultracapacitor 10, in accordance with one or more embodiments of the present invention. The circuit model 600 is implemented within the simulation platform 320, such as Simscape®, to approximate the simulated behaviour of the given ultracapacitor 10 being modelled. Simscape is a part of the MathWorks product family, which includes MATLAB and Simulink, and enables the representation of physical components as schematic diagrams or block diagrams, and includes libraries of fundamental elements, such as resistors, capacitors, and inductors, which can be readily assembled into a model of the given ultracapacitor 10. It may be understood that the given ultracapacitor 10 is represented as the RC ladder based electrical equivalent circuit model 200 in the circuit model 600. The simulated behaviour of the given ultracapacitor 10 aids in understanding how the given ultracapacitor 10 will perform under various electrical conditions, thereby assisting in the development of an accurate and reliable model of the given ultracapacitor 10.

As shown, the circuit model 600 is equipped a constant current source 602 and a constant voltage source 604 with the capability to provide constant current charging mode and constant voltage charging mode, respectively. In the constant current charging mode, a steady current is supplied to the given ultracapacitor 10 until it reaches its rated voltage, following which the charging process ceases. Conversely, in the constant voltage charging mode, the given ultracapacitor 10 is connected to a voltage source equal to its rated voltage. This enables the simulation to reflect the behaviour of the given ultracapacitor 10 under both charging modes, thereby providing a comprehensive representation of its overall performance. The circuit model 600 is also equipped with a current sensor 612 and a voltage sensor 614, which measure the current and the voltage, respectively, at the given ultracapacitor 10 at any given instant, which may be then utilized to generate at least one simulated charge-discharge plot (as discussed in detail later in the description).

Herein, the simulation platform 320 is configured (programmed), by the processor 330, to generate at least one simulated charge-discharge plot (based on readings from the current sensor 612 and the voltage sensor 614) by using same values for the one or more constant currents and/or the one or more constant voltages in the circuit model 600 (as used in the capacitor modelling apparatus 310) along with an initial set of values for simulated capacitors and simulated resistors in the RC ladder based electrical equivalent circuit model 200 (as defined later) of the given ultracapacitor 10. That is, to generate the simulated charge-discharge plot, the simulation platform 320 uses the same values for the constant currents and/or constant voltages in the circuit model 600 as used in the capacitor modelling apparatus 310. For this purpose, the processor 330 may program or configure the simulation platform 320 by providing specific instructions to the simulation platform 320. This ensures a proper comparison between the actual charge-discharge behaviour of the ultracapacitor as measured by the capacitor modelling apparatus 310 and the simulated behaviour generated by the simulation platform 320.

Now referring back to FIG. 1, in combination with FIGS. 2-6, the various steps of the method 100 as described hereinafter may be executed in the system 300, or specifically in the processor 330 of the system 300, for modelling the given ultracapacitor 10. It may be appreciated that although the method 100 is illustrated and described as a sequence of steps, it may be contemplated that various embodiments of the method 100 may be performed in any order or a combination and may include additional steps without any limitations.

In embodiments of the present invention, at step 110, the method 100 includes obtaining, from the capacitor modelling apparatus 310, at least one measured charge-discharge plot for the given ultracapacitor 10 to be modelled. Herein, the capacitor modelling apparatus 310 generates the at least one measured charge-discharge plot by providing one or more constant currents and/or one or more constant voltages to one or more of the given ultracapacitors 10 utilized therein. As discussed, to generate the measured charge-discharge plot for the given ultracapacitor 10, the programmable electric sources 512 are configured by the controller 520 in the capacitor modelling apparatus 310 to supply one or more constant currents and/or one or more constant voltages to the given ultracapacitors 10 therein. This is done for each of the test circuits 510 within the capacitor modelling apparatus 310. By controlling the electric source in this manner, the capacitor modelling apparatus 310 may simulate the charge-discharge cycles of the given ultracapacitor 10 under various conditions. The measured charge-discharge plot generated from this process represents the electrical characteristics of the given ultracapacitor 10 under a given set of conditions. The measured charge-discharge plot depicts how the given ultracapacitor 10 charges (increases its stored energy) and discharges (releases its stored energy) over time, and thus provides valuable information regarding performance of the given ultracapacitor 10, such as its maximum energy storage capacity, rate of energy discharge, and the impact of various conditions on its performance.

At step 120, the method 100 includes generating, in a simulation platform 320, at least one simulated charge-discharge plot by using same values for the one or more constant currents and/or the one or more constant voltages in the circuit model 600 with an initial set of values for simulated capacitors and simulated resistors in the RC ladder based electrical equivalent circuit model 200 configured to approximate behaviour of the given ultracapacitor 10 therein. Herein, the RC ladder based electrical equivalent circuit model 200 is a simplified representation of behaviour of the given ultracapacitor 10, including a series of resistors and capacitors. To start the simulation, the simulation platform 320 uses the initial set of values for the simulated capacitors and simulated resistors in the RC ladder based electrical equivalent circuit model 200 of the given ultracapacitor 10. The initial values represent a starting point for the simulation and are usually estimated based on specifications of the given ultracapacitor 10. The simulation platform 320 then calculates how the simulated given ultracapacitor 10 would charge and discharge under these conditions, based on the current values of the simulated capacitors and resistors in the RC ladder based electrical equivalent circuit model 200. The resultant simulated charge-discharge plot depicts the charge-discharge behaviour of the given ultracapacitor 10 as predicted by the simulation platform 320.

At step 130, the method 100 includes optimizing by changing the initial set of values to converge the at least one simulated charge-discharge plot to the at least one measured charge-discharge plot. The optimization process involves adjusting the initial values of the simulated resistors and capacitors in the RC ladder based electrical equivalent circuit model 200 to achieve a close match between the simulated charge-discharge plot and the measured charge-discharge plot. In other words, the optimization process seeks to reduce the difference or discrepancy between the simulated and measured behaviours of the given ultracapacitor 10. This process involves a comparison of the said two plots, after which adjustments are made to the values of the simulated capacitors and resistors. This optimization process is iterative, meaning that it is repeated several times to gradually refine accuracy of parameters (values) for the resistances and capacitances employed in the in the RC ladder based electrical equivalent circuit model 200.

As known from the RC ladder based electrical equivalent circuit model 200, there are total of eight (8) parameters to be estimated, i.e., the resistance '$R_1$', the capacitance '$C_1$', and the capacitance '$C_v$' of the immediate branch 210; the resistance '$R_2$' and the capacitance '$C_2$' of the delayed branch 220; the resistance '$R_3$' and the capacitance '$C_3$' of the long-term branch 230; and the discharge resistance '$R_d$' of the last branch 240. Herein, the adjustments may involve mathematical techniques such as gradient descent or more complex optimization algorithms. Generally, the principle remains the same, i.e., the algorithm takes the current values of the simulated capacitors and resistors, calculates the resulting simulated charge-discharge plot, compares it to the measured plot, and then determines the direction in which the simulated capacitor and resistor values should be adjusted to reduce the discrepancy. In an example, the optimization is carried out using a combination of physics and data driven methods, in which physics of the circuit and the charge discharge curves both contribute to the optimization scheme, including using, for example neural networks. In the present examples, the optimization involves iterative curve fitting, which is a technique used to fit a mathematical model or function to a set of data points by iteratively adjusting the parameters of the model to minimize the difference between the predictions of the model and the observed data.

Figure 7:
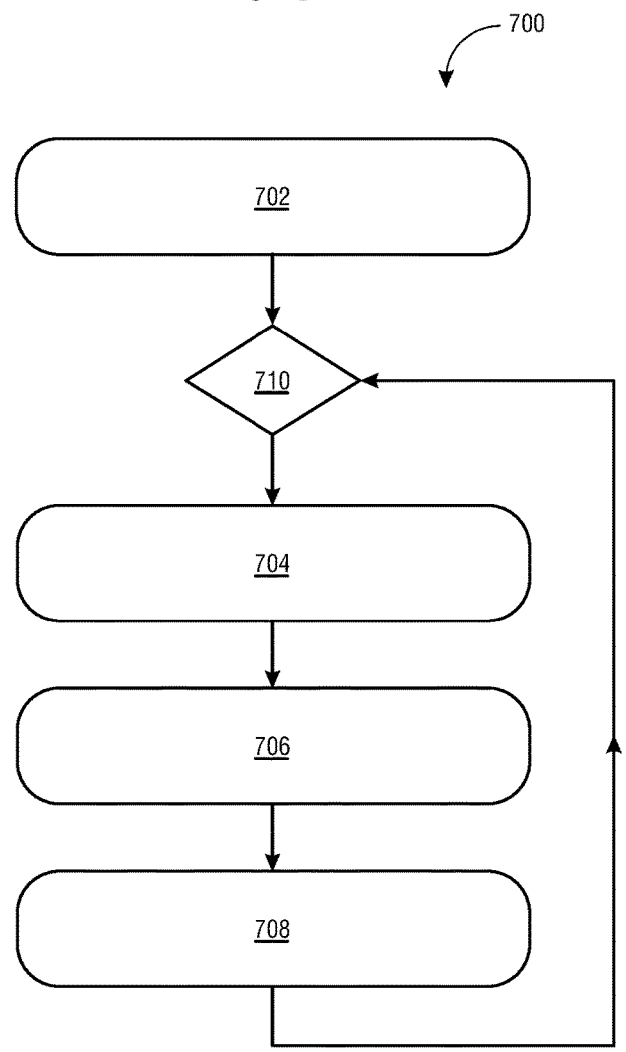
FIG. 7 is a flowchart providing steps involved in an optimization process for determining values for the simulated capacitors and the simulated resistors in the RC ladder based electrical equivalent circuit model of the given ultracapacitor, in accordance with one or more embodiments of the present invention.

Referring to FIG. 7, illustrated is a flowchart providing steps involved in the optimization process (as represented by reference numeral 700). As discussed, the RC ladder based electrical equivalent circuit model 200 may include multiple RC branches connected in parallel. In these cases, the processor 330 optimizes each branch individually in a sequence, starting from an immediate branch and proceeding to the next until all branches have been optimized. The optimization process involves estimating intermediate values for the capacitors and resistors, repeating this estimation until the simulated charge-discharge plot converges with the measured plot for each branch, and then moving on to the next branch.

In particular, at step 702, the optimization process 700 starts with pre-processing of the at least one measured charge-discharge plot from the capacitor modelling apparatus 310. It may be appreciated that in order to establish accurate measurements, it is important to account for any inherent offsets that might exist in the optimization process 700 due to internal or environmental factors. These offsets, if not corrected, could distort the accuracy of the optimization process 700. In the present embodiments, the optimization process 700 starts by establishing an offset for the capacitor modelling apparatus 310 employing the ADC. For this purpose, the optimization process 700 includes sampling a baseline signal for the capacitor modelling apparatus 310 without injecting signal therein. This involves measuring the signal coming from the capacitor modelling apparatus 310 when no external signal is being injected into it. The baseline signal represents the internal noise or the default signal state of the capacitor modelling apparatus 310 when it is not actively engaged in the characterization process. This could include the inherent electronic noise in the capacitor modelling apparatus 310, minor voltage drifts, or any bias that might be present. Then, the optimization process 700 includes sampling ADC signal by injecting a predefined signal in the capacitor modelling apparatus 310, such that the predefined signal is known to be used by the ADC and unused by the given ultracapacitor 10. This signal acts as a reference signal for the ADC, which is of known amplitude and frequency that is not used by the ultracapacitor 10, thus ensuring that it does not interfere with the characterization process. Finally, the optimization process 700 includes establishing the offset based on the sampled baseline signal and the sampled ADC signal. This offset may be a difference between the known value of the injected signal and the measured value of the ADC signal, and may represent the inherent inaccuracy of the capacitor modelling apparatus 310. Once this offset is established, it may be used to correct future measurements, enhancing the accuracy of modelling of the ultracapacitor using the method 100 as proposed in embodiments of the present invention.

The optimization process 700 further includes adjusting the at least one measured charge-discharge plot based on the established offset, prior to using the at least one measured charge-discharge plot for convergence with the at least one simulated charge-discharge plot. This process of adjusting the measured charge-discharge plot based on the established offset may involve re-calibrating the obtained data to counteract any systematic deviations observed during the baseline and injected signal measurements. Specifically, each point on the measured charge-discharge plot may be adjusted by subtracting the offset value therefrom. This effectively "shifts" the whole plot by the offset amount, correcting for the inherent deviation that the capacitor modelling apparatus 310 may have introduced. This is done prior to the use of these measured plots for convergence with the simulated charge-discharge plots, and the adjusted measured charge-discharge plot may now serve as a more accurate representation of the true behaviour of the given ultracapacitor 10.

In some embodiments, the optimization process 700 further includes processing the at least one measured charge-discharge plot by implementing one or more of a moving average filter technique and a wavelet based denoising technique. This is done to adjust the obtained data appropriately for the noise, and further refine the measured charge-discharge plot. The moving average filter technique is a simple, yet effective method to smooth out short-term fluctuations and highlight longer-term trends or cycles in the data. It works by taking a window of 'n' data points in the measured charge-discharge plot and replacing each data point with the average of that data point and the 'n−1' preceding data points. This process is then repeated, shifting the window across the entire set of data points in the measured charge-discharge plot. Additionally, or alternatively, the wavelet-based denoising is a commonly used approach that takes advantage of the properties of wavelet transforms to achieve this goal. Herein, the measured charge-discharge plot data is decomposed into different frequency components using a wavelet transform. Once the data is decomposed, a thresholding operation is applied to the wavelet coefficients. After applying the thresholding operation, the denoised wavelet coefficients are used to reconstruct the signal. FIG. 8A provides a graph 800A with plots depicting the wavelet based denoising process with solid plot representing the initial/original plot, and dashed plot represented the filtered plot. The result is a smoothed curve that can help reduce random noise and isolate significant trends in the measured charge-discharge plot.

At step 704, the optimization process 700 involves a step (i) which includes constraining to estimate a first set of intermediate values for the one or more of the simulated capacitors and the one or more of the simulated resistors, like the resistance '$R_1$', the capacitance '$C_1$', and the capacitance '$C_v$' for the immediate branch 210 of the multiple RC branches at a given instance. Herein, the resistance '$R_1$' is estimated with simple V=iR equation. Further, since the capacitance '$C_1$' is a regular capacitor while the capacitance '$C_v$' is a voltage dependent capacitor, this feature may then be used to assume that the capacitance 'C' is charged first before charge on the capacitance 'C' starts building. Therefore, the capacitance '$C_1$' charges linearly over time with a slope of i/c (where, 'i' is the applied current and 'c' is the capacitance). Therefore, a tangent line may be drawn to infer the inflex point and the slope of the line is used as the initial guess for the capacitance '$C_1$', as shown in graph 800B of FIG. 8B. With these two values (i.e., the resistance '$R_1$' and the capacitance '$C_1$') in place, a solver routine may be run to estimate the capacitance '$C_v$' to fit the immediate branch 210 of the RC ladder based electrical equivalent circuit model 200.

At step 706, the optimization process 700 involves a step (ii) which includes repeating the step (i) to estimate a final set of intermediate values for the one or more of the simulated capacitors and the one or more of the simulated resistors for the immediate branch 210 until the at least one simulated charge-discharge plot therefor substantially converges with the corresponding at least one measured charge-discharge plot. In this case, the optimization process 700 is stopped after a few iterations, as shown in graphs 800C-800F of FIGS. 8C-8F, to have a rough estimate of the resistance '$R_1$', the capacitance '$C_1$', and the capacitance '$C_v$' for the immediate branch 210, which in this case may be $R_1$=0.19194 Ohms, $C_1$=5.8 F, and $C_v$=2.0897 F.

At step 708, the optimization process 700 involves a step (iii) which includes constraining, using the final set of intermediate values for the one or more of the simulated capacitors and the one or more of the simulated resistors for the immediate branch 210, to estimate a first set of intermediate values for the one or more of the simulated capacitors and the one or more of the simulated resistors for next branches, to the immediate branch, of the multiple RC branches at a given instance. Further, at step 708, the optimization process 700 involves a step (iv) which includes repeating the step (iii) to estimate a final set of intermediate values for the one or more of the simulated capacitors and the one or more of the simulated resistors for the next branches until the at least one simulated charge-discharge plot therefor converges with the corresponding at least one measured charge-discharge plot. That is, the optimization process 700 involves using the final set of intermediate values for the resistance '$R_1$', the capacitance '$C_1$', and the capacitance 'C' to get a rough estimate for the resistance '$R_2$' and the capacitance '$C_2$' of the delayed branch 220 as well as the resistance '$R_3$' and the capacitance '$C_3$' of the long-term branch 230. FIGS. 8G-8J provide graphs 800G-800J depicting such process of fitting delayed and long term branches which may involve up to five iterations.

At step 710, the optimization process 700 involves a step (v) which includes repeating the steps (i)-(iv) to determine the final set of values for the simulated capacitors and the simulated resistors in the RC ladder based electrical equivalent circuit model 200 of the given ultracapacitor 10. That is, the entire procedure as described in the preceding paragraphs for the optimization process 700 is repeated to obtain a better fit and together with different discharge curves to make the estimates for the resistance '$R_1$', the capacitance '$C_1$', and the capacitance '$C_v$' of the immediate branch 210; the resistance '$R_2$' and the capacitance '$C_2$' of the delayed branch 220; and the resistance '$R_3$' and the capacitance '$C_3$' of the long-term branch 230 more robust.

The optimization process 700 may further need to estimate value for the discharge resistor '$R_d$' of the last branch 240. The discharge resistor '$R_d$' represents the intrinsic resistance encountered by the electric charge stored in the ultracapacitor during its discharge process. For this purpose, the optimization process 700, first, includes allowing, by the controller 520, the given ultracapacitor 10 to discharge in the capacitor modelling apparatus 310. Herein, no external power or current is being supplied to the ultracapacitor 10, and instead it is left to discharge naturally. Further, the optimization process 700 includes measuring, by the controller 520, a discharge rate for the given ultracapacitor 10 while discharging in the capacitor modelling apparatus 310. This can be done using current and voltage sensing mechanisms within the capacitor modelling apparatus 310. Further, the optimization process 700 includes determining, by the processor 330, a value for the discharge resistor '$R_d$' based on the measured discharge rate for the given ultracapacitor 10. It may be understood by a person skilled in the art that the value of the discharge resistor '$R_d$' is inversely proportional to the discharge rate. In other words, a high discharge rate would suggest a low discharge resistance and vice versa. Mathematically, the value of the discharge resistor can be computed using Ohm's law, which states that the resistance '$R_d$' is equal to the voltage divided by the current. Such implementation may be contemplated by a person skilled in the art and thus not repeated herein for brevity of embodiments of the present invention.

With this step 140 of the method 100 which includes determining a final set of values for the simulated capacitors and the simulated resistors in the RC ladder based electrical equivalent circuit model 200 of the given ultracapacitor 10 based on the at least one simulated charge-discharge plot substantially converging to the at least one measured charge-discharge plot is also concluded. Here, the final set of values for the simulated capacitors and the simulated resistors in the RC ladder based electrical equivalent circuit model 200 of the given ultracapacitor 10 is determined. These values are set when the simulated charge-discharge plot, generated by the simulation platform 320, substantially converges to the measured charge-discharge plot, which is obtained from the capacitor modelling apparatus 310. The substantial convergence indicates that the circuit model 600 of the simulation platform 320 has successfully replicated the real-world performance of the given ultracapacitor 10, as shown by the measured charge-discharge plot from the capacitor modelling apparatus 310. In other words, the difference between the said two plots is minimized to an acceptable level. This level can be pre-set based on the specific requirements of the model of the given ultracapacitor 10, such as the degree of precision required, the computational resources available, or the limitations of the modelling techniques.

Upon determining the final set of values for the simulated capacitors and resistors in the RC ladder based electrical equivalent circuit model 200 of the given ultracapacitor 10, this model is said to be optimized. The optimization signifies that the model may effectively mimic the actual performance characteristics of the given ultracapacitor 10 being modelled, providing a reliable basis for predicting its behaviour under varying conditions. Such optimized model may act as a "digital twin" for the given ultracapacitor 10. This model becomes a powerful tool in several potential applications. For instance, the optimized model may be used to predict performance of the ultracapacitor under different scenarios, which might encompass variations in the current input, voltage input, temperature, load conditions, or aging effects, among others. It may be noted that this predicted performance may not be limited to the charge-discharge behaviour of the given ultracapacitor, but may also provide insights into other performance metrics such as power delivery and energy storage capacity, efficiency, life cycle, and thermal characteristics thereof. Further, the optimized model may be utilized in designing of systems that may potentially use the given ultracapacitor 10. These systems may be wide-ranging, including electric vehicles, renewable energy storage systems, power electronics, and the like.

The method 100 and the system 300 of embodiments of the present invention provides several significant advantages over conventional techniques for modelling of ultracapacitors as known in the art. The employed algorithm utilizes pattern search methods. It provides initial guess/steps generated using the obtained data, bypassing the need for heuristic methods. This approach is in contrast to Zubieta's proposal, which primarily fits very large capacitances and relies on data from multiple experiments. Further, the algorithm divides the problem into multiple phases and uses an iterative refinement approach. By doing so, it estimates and refines the phases a couple of times using data from multiple experiments. This iterative approach enables the algorithm to progressively improve its accuracy, providing more reliable modelling results for the ultracapacitor. It may be appreciated that the proposed algorithm is extendable for ultracapacitors of even higher capacitances (in hundreds or thousands of farads with longer algorithm times as is without any modification. Further, embodiments of the present invention proposes the capacitor modelling apparatus 310 to be used for measurements, which is designed to be portable and equipped with the heat management system 530, and with the potential for low-cost manufacturing. The design has also been simplified to ensure ease of handling of the ultracapacitors, making the technology more accessible and user-friendly.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for modelling an ultracapacitor, the method comprising:
   obtaining, from a capacitor modelling apparatus, at least one measured charge-discharge plot for a given ultracapacitor to be modelled, wherein the capacitor modelling apparatus generates the at least one measured charge-discharge plot by providing one or more constant currents and/or one or more constant voltages to one or more of the given ultracapacitors utilized therein;
   generating, in a simulation platform, at least one simulated charge-discharge plot by using same values for the one or more constant currents and/or the one or more constant voltages in a circuit model with an initial set of values for simulated capacitors and simulated resistors in a Resistor-Capacitor ladder based electrical equivalent circuit model configured to approximate behaviour of the given ultracapacitor therein;
   optimizing by changing the initial set of values to converge the at least one simulated charge-discharge plot to the at least one measured charge-discharge plot; and
   determining a final set of values for the simulated capacitors and the simulated resistors in the RC ladder based electrical equivalent circuit model of the given ultracapacitor based on the at least one simulated charge-discharge plot substantially converging to the at least one measured charge-discharge plot.

2. The method according to claim 1, wherein the RC ladder based electrical equivalent circuit model of the given ultracapacitor is defined with multiple RC branches connected in parallel, with each one of the multiple RC branches comprising one or more of the simulated capacitors disposed in series with one or more of the simulated resistors, and wherein the optimization is performed by steps of:
   (i) constraining to estimate a first set of intermediate values for the one or more of the simulated capacitors and the one or more of the simulated resistors for an immediate branch of the multiple RC branches at a given instance;
   (ii) repeating the step (i) to estimate a final set of intermediate values for the one or more of the simulated capacitors and the one or more of the simulated resistors for the immediate branch until the at least one simulated charge-discharge plot therefor substantially converges with the corresponding at least one measured charge-discharge plot;
   (iii) constraining, using the final set of intermediate values for the one or more of the simulated capacitors and the one or more of the simulated resistors for the immediate branch, to estimate a first set of intermediate values for the one or more of the simulated capacitors and the one or more of the simulated resistors for next branches, to the immediate branch, of the multiple RC branches at a given instance;

(iv) repeating the step (iii) to estimate a final set of intermediate values for the one or more of the simulated capacitors and the one or more of the simulated resistors for the next branches until the at least one simulated charge-discharge plot therefor converges with the corresponding at least one measured charge-discharge plot; and (v) repeating the steps (i)-(iv) to determine the final set of values for the simulated capacitors and the simulated resistors in the RC ladder based electrical equivalent circuit model of the given ultracapacitor.

3. The method according to claim 2, wherein the RC ladder based electrical equivalent circuit model of the given ultracapacitor is further defined with a discharge resistor disposed in a last branch of the multiple RC branches, and wherein the method comprises:

allowing the given ultracapacitor to discharge in the capacitor modelling apparatus;

measuring a discharge rate for the given ultracapacitor while discharging in the capacitor modelling apparatus; and determining a value for the discharge resistor based on the measured discharge rate for the given ultracapacitor.

4. The method according to claim 1 further comprising establishing an offset for the capacitor modelling apparatus employing an analog-to-digital converter, wherein the method comprises:

sampling a baseline signal for the capacitor modelling apparatus without injecting signal therein;

sampling ADC signal by injecting a predefined signal in the capacitor modelling apparatus, wherein the predefined signal is known to be used by the ADC and unused by the given ultracapacitor; and establishing the offset based on the sampled baseline signal and the sampled ADC signal.

5. The method according to claim 4 further comprising adjusting the at least one measured charge-discharge plot based on the established offset, prior to using the at least one measured charge-discharge plot for convergence with the at least one simulated charge-discharge plot.

6. The method according to claim 1 further comprising processing the at least one measured charge-discharge plot by implementing one or more of a moving average filter technique and a wavelet based denoising technique.

7. A system for modelling an ultracapacitor, the system comprising:

a capacitor modelling apparatus comprising:

one or more test circuits, with each of the one or more test circuits comprising a given ultracapacitor to be modelled, and a programmable electric source electrically connected in series to the given ultracapacitor and configured to provide a constant current and/or a constant voltage thereto; and a controller in signal communication with the one or more test circuits, wherein the controller is configured to program the programmable electric source to provide one or more constant currents and/or one or more constant voltages to the corresponding given ultracapacitor for each of the one or more test circuits, to generate at least one measured charge-discharge plot for the given ultracapacitor;

a simulation platform provided with a circuit model having a Resistor-Capacitor ladder based electrical equivalent circuit model configured to approximate behaviour of the given ultracapacitor, the simulation platform configured to generate at least one simulated charge-discharge plot by using same values for the one or more constant currents and/or the one or more constant voltages in the circuit model with an initial set of values for simulated capacitors and simulated resistors in the RC ladder based electrical equivalent circuit model of the given ultracapacitor; and a processor configured to:

optimize by changing the initial set of values to converge the at least one simulated charge-discharge plot to the at least one measured charge-discharge plot; and determine a final set of values for the simulated capacitors and the simulated resistors in the RC ladder based electrical equivalent circuit model of the given ultracapacitor based on the at least one simulated charge-discharge plot substantially converging to the at least one measured charge-discharge plot.

8. The system according to claim 7, wherein the RC ladder based electrical equivalent circuit model of the given ultracapacitor is defined with multiple RC branches connected in parallel, with each one of the multiple RC branches comprising one or more of the simulated capacitors disposed in series with one or more of the simulated resistors, and wherein the processor is configured to perform the optimization by steps of:

(i) constraining to estimate a first set of intermediate values for the one or more of the simulated capacitors and the one or more of the simulated resistors for an immediate branch of the multiple RC branches at a given instance;

(ii) repeating the step (i) to estimate a final set of intermediate values for the one or more of the simulated capacitors and the one or more of the simulated resistors for the immediate branch until the at least one simulated charge-discharge plot therefor substantially converges with the corresponding at least one measured charge-discharge plot;

(iii) constraining, using the final set of intermediate values for the one or more of the simulated capacitors and the one or more of the simulated resistors for the immediate branch, to estimate a first set of intermediate values for the one or more of the simulated capacitors and the one or more of the simulated resistors for next branches, to the immediate branch, of the multiple RC branches at a given instance;

(iv) repeating the step (iii) to estimate a final set of intermediate values for the one or more of the simulated capacitors and the one or more of the simulated resistors for the next branches until the at least one simulated charge-discharge plot therefor converges with the corresponding at least one measured charge-discharge plot; and (v) repeating the steps (i)-(iv) to determine the final set of values for the simulated capacitors and the simulated resistors in the RC ladder based electrical equivalent circuit model of the given ultracapacitor.

9. The system according to claim 8, wherein the RC ladder based electrical equivalent circuit model of the given ultracapacitor is further defined with a discharge resistor disposed in a last branch of the multiple RC branches, and wherein the controller, in the capacitor modelling apparatus, is further configured to:

allow the given ultracapacitor to discharge in the capacitor modelling apparatus; and measure a discharge rate for the given ultracapacitor while discharging in the capacitor modelling apparatus; and wherein the processor is configured to determine a value for the discharge resistor based on the measured discharge rate for the given ultracapacitor.

10. The system according to claim 7, wherein the capacitor modelling apparatus comprises an array of test circuits disposed in parallel to each other, with each of the array of test circuits comprising a switch, and wherein the controller is configured to:

activate one of the array of test circuits at a given instant by regulating the corresponding switch to closed position thereof; and provide the one or more constant currents and/or the one or more constant voltages to the given ultracapacitor of the activated one of the array of test circuits to generate the at least one measured charge-discharge plot therefor.

11. The system according to claim 10, wherein the controller is configured to:

program each one of the programmable electric sources in the array of test circuits to provide same constant current to the corresponding given ultracapacitors and/or different constant currents to the different given ultracapacitors, to generate a set of measured charge-discharge plots for the given ultracapacitors; and compute an average of the set of measured charge-discharge plots to obtain the at least one measured charge-discharge plot.

12. The system according to claim 10, wherein the capacitor modelling apparatus comprises at least three test circuits in the array of test circuits.

13. The system according to claim 7, wherein the one or more constant currents and/or one or more constant voltages are defined based on a rated capacity of the given ultracapacitor.

14. The system according to claim 7, wherein the controller is a microprocessor with a built-in analog-to-digital converter with multiplexed channels.

15. The system according to claim 7, wherein the capacitor modelling apparatus further comprises:

a temperature sensor configured to measure a temperature value for components of the capacitor modelling apparatus;

a heat management unit in signal communication with the temperature sensor to receive the measured temperature value therefrom, wherein the heat management unit is configured to regulate heating and/or cooling to maintain a substantially constant temperature for the components of the capacitor modelling apparatus by implementing a feedback loop based on the measured temperature value.

* * * * *